(12) United States Patent
Chu et al.

(10) Patent No.: US 8,432,207 B1
(45) Date of Patent: Apr. 30, 2013

(54) METHOD AND APPARATUS FOR CORRECTING THE DUTY CYCLE OF A HIGH SPEED CLOCK

(75) Inventors: Jackie Chu, Fremont, CA (US); Yikai Liang, Fremont, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 13/341,017

(22) Filed: Dec. 30, 2011

(51) Int. Cl.
*H03K 3/017* (2006.01)

(52) U.S. Cl.
USPC .......................................... 327/175; 327/172

(58) Field of Classification Search .................. None
See application file for complete search history.

(56) References Cited

U.S. PATENT DOCUMENTS

| | | | |
|---|---|---|---|
| 5,757,218 A | 5/1998 | Blum | |
| 6,181,178 B1 | 1/2001 | Choi | |
| 6,246,660 B1 | 6/2001 | Yanagawa | |
| 6,411,145 B1 | 6/2002 | Kueng et al. | |
| 6,958,639 B2 | 10/2005 | Park et al. | |
| 7,015,739 B2 | 3/2006 | Lee et al. | |
| 7,307,461 B2 | 12/2007 | Nguyen et al. | |
| 7,863,958 B2 | 1/2011 | Boerstler et al. | |
| 7,990,194 B2 | 8/2011 | Shim | |
| 2002/0084817 A1 | 7/2002 | Nair et al. | |
| 2008/0001643 A1* | 1/2008 | Lee | 327/175 |
| 2009/0045856 A1* | 2/2009 | Spirkl et al. | 327/158 |
| 2011/0001527 A1 | 1/2011 | Lee | |
| 2011/0001532 A1 | 1/2011 | Seo | |

* cited by examiner

*Primary Examiner* — Cassandra Cox
(74) *Attorney, Agent, or Firm* — Ingrassia Fisher & Lorenz, P.C.

(57) ABSTRACT

Methods and apparatuses are provided for duty cycle correction of high-speed clock circuits. The apparatus includes a duty cycle interpolator receiving a clock source for providing a duty cycle corrected clock signal. The duty cycle corrected clock signal is filtered and compared to a reference signal, the result of which is clocked into a shift register. The shift register provides complementary N-bit duty cycle correction signals to the duty cycle interpolator for adjusting the duty cycle of the clock signal to provide the duty cycle corrected clock signal. The method includes filtering a duty cycle corrected clock signal to provide a filtered signal and comparing the filtered signal to a reference signal, the result of is clocked into a shift register. The shift register provides complementary N-bit duty cycle correction signals to a duty cycle interpolator for adjusting the duty cycle of a clock signal.

19 Claims, 2 Drawing Sheets

METHOD AND APPARATUS FOR CORRECTING THE DUTY CYCLE OF A HIGH SPEED CLOCK

FIELD OF THE INVENTION

The technical field relates to the field of data clocks suitable for use in high speed circuits. More specifically, this invention relates to the field of duty cycle correction for data and clock recovery circuits or any other high speed integrated circuits.

BACKGROUND

Contemporary digital integrated circuits operate at very high speeds in various applications such as personal computers, game playing devices and video equipment. As the speed of modern digital integrated circuits increase it becomes increasing important to provide a clock (timing) signal that has a precisely controlled duty cycle (which typically is 50%). Any movement to either side of the ideal duty cycle may affect the performance or the robustness of data capture, thus degrading the performance of the device or system employing the high speed chip. Duty cycle distortion (e.g., jitter) may be caused by variations in manufacturing process, operating voltage or temperature. While care is taken to control these variables, there exists a need to correct duty cycle error using a minimal amount of circuitry and power.

BRIEF SUMMARY OF EMBODIMENTS OF THE INVENTION

An apparatus is provided for duty cycle correction of high-speed clock circuits. The apparatus comprises a duty cycle interpolator receiving a clock source for providing a duty cycle corrected clock signal. The duty cycle corrected clock signal is filtered and compared to a reference signal to provide complementary digital output signals to a shift register, which in turn, provides complementary duty cycle correction signals to the duty cycle interpolator. Responsive to the complementary duty cycle correction signals, the duty cycle of the clock signal is adjusted to provide the duty cycle corrected clock signal.

A method is provided for cycle correction of high-speed clock circuits. The method comprises filtering a duty cycle corrected clock signal to provide a filtered signal and comparing the filtered signal to a reference signal to provide complementary digital output signals. The complementary digital output signals are stored in a shift register that provides complementary duty cycle correction signals to a duty cycle interpolator. The duty cycle interpolator adjusts the duty cycle of a clock signal to provide the duty cycle corrected clock signal.

BRIEF DESCRIPTION OF THE DRAWINGS

Embodiments of the present invention will hereinafter be described in conjunction with the following drawing figures, wherein like numerals denote like elements.

DETAILED DESCRIPTION

The following detailed description is merely exemplary in nature and is not intended to limit the disclosure or the application and uses of the disclosure. As used herein, the word "exemplary" means "serving as an example, instance, or illustration." Thus, any embodiment described herein as "exemplary" is not necessarily to be construed as preferred or advantageous over other embodiments. Moreover, as used herein, the word "high speed chip" encompasses integrated circuit chips in all applications. All of the embodiments described herein are exemplary embodiments provided to enable persons skilled in the art to make or use the disclosed embodiments and not to limit the scope of the disclosure which is defined by the claims. Furthermore, there is no intention to be bound by any expressed or implied theory presented in the preceding technical field, background, brief summary, the following detailed description or for any particular processor architecture.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language.

Additionally, the following description refers to elements or features being "connected" or "coupled" together. As used herein, "connected" may refer to one element/feature being directly joined to (or directly communicating with) another element/feature, and not necessarily mechanically. Likewise, "coupled" may refer to one element/feature being directly or indirectly joined to (or directly or indirectly communicating with) another element/feature, and not necessarily mechanically. However, it should be understood that, although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Finally, for the sake of brevity, conventional techniques and components related to processor architecture and other functional aspects of a processor system (and the individual operating components of the system) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the invention.

Figure 1:
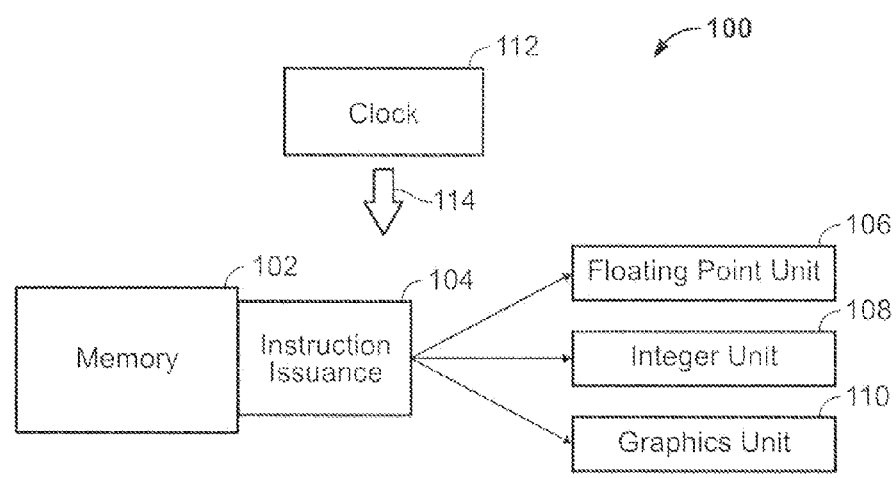
FIG. 1 is a simplified exemplary block diagram of a processor suitable for use with the embodiments of the present disclosure.

Referring now to FIG. 1, a simplified exemplary block diagram is shown illustrating a processor 100 suitable for use with the embodiments of the present disclosure. In some embodiments, the processor 100 would be realized as a single core in a large-scale integrated circuit (LSIC). In other embodiments, the processor 100 could be one of a dual or multiple core LSIC to provide additional functionality in a single LSIC package. As is typical, processor 100 includes a memory section 102 containing programs or instructions for execution by the processor 100. The memory 102 can be any type of suitable memory. This would include the various types of dynamic random access memory (DRAM) such as SDRAM, the various types of static RAM (SRAM), and the various types of non-volatile memory (PROM, EPROM, and flash). The processor 100 also includes an instruction issuance unit 104. In a graphics processor embodiment, the instruction issuance unit 104 is commonly referred to as a sequencer, while in general purpose processing embodiment, the instruction issuance unit 104 is commonly referred to as a scheduler.

The processor 100 of FIG. 1 also includes a plurality of operational units 106-110. These operation units may include floating-point units 106 that perform float-point computations, integer processing units 108 for performing integer computations, and/or graphics processing units 110 performing various specialized graphic or imaging tasks. The processor 100 also includes a clock circuit 112 that provides a clock signal 114 to various components of the processor 100. As noted above, it has become increasing important to provide a clock (timing) signal 114 that has a precisely controlled duty cycle (which typically is 50%). Duty cycle distortion is typically manifested in a movement to either side of the ideal duty cycle, which may affect the performance of processor 100. Consequently, the clock circuit 112 of the exemplary embodiments disclosed herein include duty cycle correction circuitry to maintain the duty cycle of the clock signal 114 within precisely controlled limits.

Figure 2:
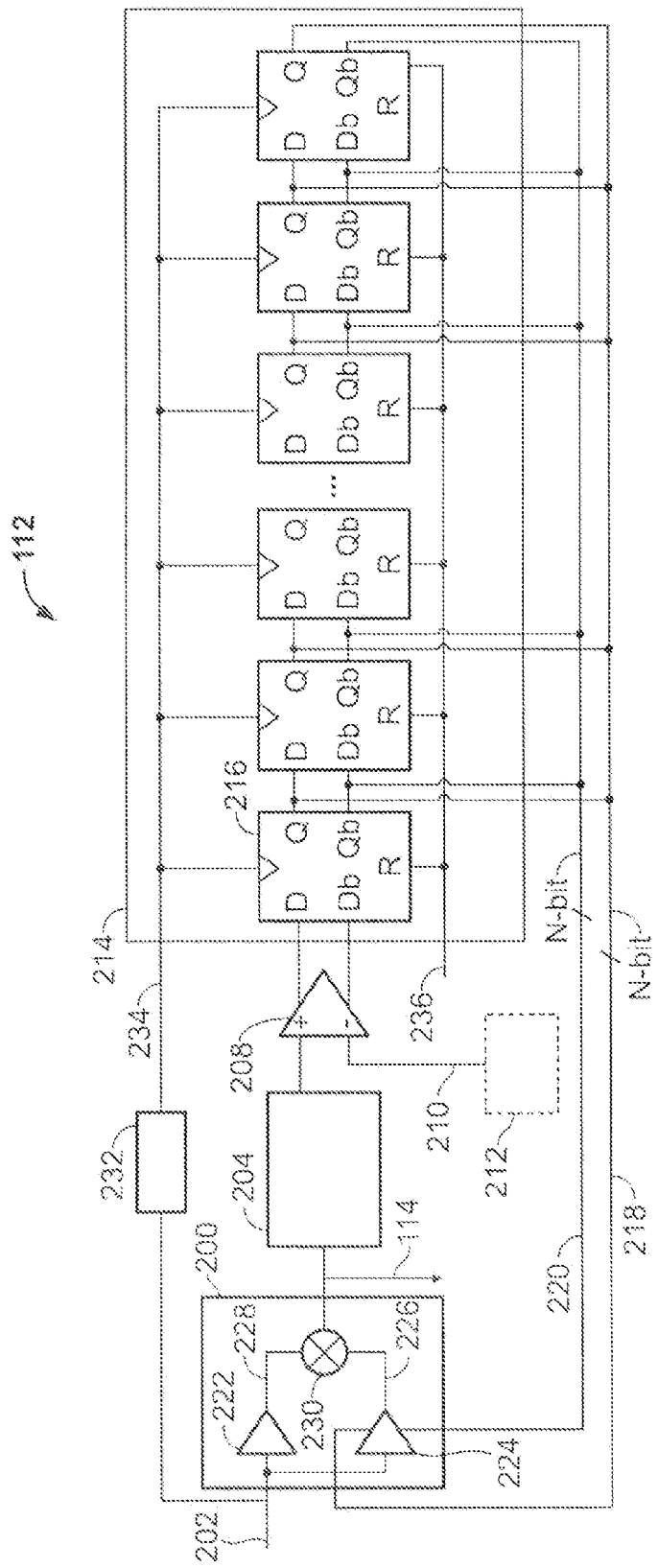
FIG. 2 is an exemplary block diagram of a clock circuit having a duty cycle correction circuit following the teaching of the present disclosure.

Referring now to FIG. 2, an exemplary block diagram of a clock circuit 112 having duty cycle correction circuitry is shown following the teaching of the present disclosure. The clock circuit includes a duty cycle interpolator 200, which receives an input clock signal 202 and provides a duty cycle corrected clock signal 114. The duty cycle corrected clock signal 114 is filtered by a low pass filter 204, which provides a near DC signal 206 of approximately 0.5 volts as one input to a comparator 208. The other input to the comparator 208 is coupled to a reference potential 210, which may optionally be provided by a calibrated reference generator 212 if the offset voltage of comparator 208 is not low enough to differentiate potentials around 0.5 volts. The comparator 208 provides complementary output signals to a shift register 214, which in some embodiments may be realized as a series of cascaded flip-flops 216 (six shown). The collective output of the series of cascaded flip-flops 216 provide a N-bit digital word that is used as a feedback control mechanism for correcting the duty cycle of the input clock 202 as will be described below. The number of flip-flop employed in any particular implementation will depend upon the configuration and/or components used to realize the duty cycle interpolator 200, or the level of duty cycle control desired. According to exemplary embodiments, twelve (N=12) flip-flops 214 provide complementary 12-bit digital words as duty cycle correcting feedback signals 218 and 220.

The input clock signal 202 may be provided by a phase locked loop, crystal oscillator, clock tree or as an external (to the processor 100 of FIG. 1) clock. The input clock need not be of particularly high quality in terms of low duty cycle jitter or imbalance as the duty cycle may be corrected to be approximately +/−0.5% of an ideal 50% duty cycle for a high speed clock up to approximately 9 GHz following the teachings of the present disclosure.

The duty cycle interpolator 200 includes a buffer 222 and a tunable duty cycle buffer 224. The tunable duty cycle buffer 224 receives the input clock signal 202 and provides an output signal 226 have a shifted duty cycle depending upon the state of the complementary N-bit digital words 218 and 220. The output signal 226 and a buffered input clock signal 228 are provided to an interpolator 230, which (assuming even weighting) interpolates between the duty cycle of the signals 228 and 226 to provide the duty cycle corrected clock signal 114.

Operationally, when the filtered clock signal 206 is slightly above 0.5 volts, the comparator 208 will output a logic high (1) that is clocked (via divided clock signal 234) into the most significant bit of the shift register 214 that provides the N-bit digital duty cycle correcting feedback signal 218. Also, a logic low (0) is clocked into the most significant bit of the N-bit digital duty cycle correcting feedback signal 220. This will cause the tunable buffer 224 to shift the duty cycle of the input clock signal 202 by approximately 0.5% to adjust the duty cycle of the input clock signal 202. The shift register 214 is clocked by the input clock signal 202 divided by four (via divider 232), so that in successive divided clock signal 234 cycles, the logic high (1) in the duty cycle correcting feedback signal 218 will be moved down into lower significant bit positions, thus causing less adjustment by the tunable buffer 224.

Conversely, when the filtered duty cycle corrected clock signal 206 is slightly below 0.5 volts, the comparator 208 will output a logic low (0) that is clocked (via divided clock signal 234) into the most significant bit of the shift register 214 that provides the N-bit digital duty cycle correcting feedback signal 218. Also, a logic high (1) will be clocked into the most significant bit of the N-bit digital duty cycle correcting feedback signal 220. This will cause the tunable buffer 224 to shift the duty cycle of the input clock signal 202 by approximately −0.5% to adjust the duty cycle of the duty cycle corrected clock signal 114. Again, as the shift register 214 is successively clocked by the divided clock signal 234, the logic high (1) of the duty cycle correcting feedback signal 220 will be moved down into a lower significant bit position, thus causing less adjustment by the tunable buffer 224. In this way, the duty cycle of the duty cycle corrected clock signal 114 may be maintained within +/−0.5% between 45% to 55% duty cycle for clocks up to approximately 9 GHz. The duty cycle corrected clock signal 114 may then accurately clock the memory, the instruction issuance unit and the one or more operational units of FIG. 1.

The shift register 214 of the clock circuit 112 also includes a reset line 236, which is coupled to the reset circuitry (not shown) of the processor (100 in FIG. 1). In this way, the clock circuit starts from a known condition following a processor reset, and due to the size of the shift register 214, the duty cycle corrected clock signal 114 will be stable in approximately 12-16 divided clock signal 234 cycles.

Various processor-based devices that may advantageously use the processor (or any computational unit) of the present disclosure include, but are not limited to, laptop computers, digital books or readers, printers, scanners, standard or high-definition televisions or monitors and standard or high-definition set-top boxes for satellite or cable programming reception. In each example, any other circuitry necessary for the implementation of the processor-based device would be added by the respective manufacturer. The above listing of processor-based devices is merely exemplary and not intended to be a limitation on the number or types of processor-based devices that may advantageously use the processor (or any computational) unit of the present disclosure.

A software program embodied on computer-readable media is also contemplated. In one embodiment, the software program includes instructions for conventional semiconductor manufacturing equipment employing contemporary semiconductor processes. A first group of instructions is configured to create a duty cycle interpolator having a clock signal input and providing a duty cycle corrected clock signal. A second group of instructions is configured to create a low pass filter coupled to the duty cycle interpolator to filter the duty cycle corrected clock signal and provide a filtered signal. A third group of instructions is configured to create a comparator coupled to the low pass filter to compare the filtered signal to a reference signal and provide complementary digital output signals. Finally, a fourth group of instructions is configured to create a shift register coupled to the comparator and the duty cycle interpolator to process the complementary digital output signals and to provide complementary duty cycle correction signals to the duty cycle interpolator for adjusting the duty cycle of the clock signal to provide the duty cycle corrected clock signal.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure, it being understood that various changes may be made in the function and arrangement of elements described in an exemplary embodiment without departing from the scope of the disclosure as set forth in the appended claims and their legal equivalents.

What is claimed is:

1. A clock circuit, comprising:
   a duty cycle interpolator for processing a clock signal to provide a duty cycle corrected clock signal;
   a low pass filter coupled to the duty cycle interpolator for filtering the duty cycle corrected clock signal to provide a filtered signal;
   a comparator coupled to the low pass filter for comparing the filtered signal to a reference signal and providing complementary digital output signals; and
   a shift register coupled to the comparator and the duty cycle interpolator for processing the complementary digital output signals and for providing complementary duty cycle correction signals to the duty cycle interpolator for adjusting the duty cycle of the clock signal to provide the duty cycle corrected clock signal.

2. The clock circuit of claim 1, wherein the duty cycle interpolator comprises:
   a buffer for receiving the clock signal and for providing a buffered signal;
   a tunable buffer receiving the clock signal and providing a duty cycle tuned signal responsive to the complementary duty cycle correction signals; and
   an interpolator coupled to the buffer and the tunable buffer for interpolating the buffered signal and the duty cycle tuned signal to provide the duty cycle corrected clock signal.

3. The clock circuit of claim 1, further comprising a calibrated reference source coupled to the comparator for providing the reference signal.

4. The clock circuit of claim 1, wherein the shift register comprises a plurality of cascaded flip-flops providing N-bit complementary duty cycle correction signals to the duty cycle interpolator.

5. The clock circuit of claim 1, further comprising a divider coupled to the shift register for receiving the clock signal and providing a divided clock signal to the shift register.

6. The clock circuit of claim 1, wherein the duty cycle corrected clock signal has a duty cycle in the range of approximately +/−0.5% of 50%.

7. A method, comprising:
   filtering a duty cycle corrected clock signal to provide a filtered signal;
   comparing the filtered signal to a reference signal to provide complementary digital output signals;
   storing the complementary digital output signals in a shift register and providing complementary duty cycle correction signals;
   adjusting a duty cycle of a clock signal responsive to the complementary duty cycle correction signals to provide an adjusted clock signal; and
   interpolating between the clock signal and the adjusted clock signal to provide the duty cycle corrected clock signal.

8. The method of claim 7, further comprising dividing the clock signal to provide a divided clock signal to the shift register.

9. The method of claim 7, further comprising repeating the method until the duty cycle corrected clock signal has a duty cycle within a range of approximately +/−0.5% of 50%.

10. A processor, comprising:
    an instruction issuance unit issuing instructions;
    one or more operational units coupled to the instruction issuance unit for processing the instructions; and
    a clock circuit coupled to the instruction issuance unit and the one or more operational units for providing a duty cycle corrected clock signal, the clock circuit comprising:
    a clock source providing a clock signal;
    a duty cycle interpolator coupled to the clock source for processing the clock signal to provide the duty cycle corrected clock signal;
    a low pass filter coupled to the duty cycle interpolator for filtering the duty cycle corrected clock signal to provide a filtered signal;
    a comparator coupled to the low pass filter for comparing the filtered signal to a reference signal and providing complementary digital output signals; and
    a shift register coupled to the comparator and the duty cycle interpolator for processing the complementary digital output signals and for providing complementary duty cycle correction signals to the duty cycle interpolator for adjusting the duty cycle of the clock signal to provide the duty cycle corrected clock signal.

11. The processor of claim 10, wherein the duty cycle interpolator comprises:
    a buffer for receiving the clock signal and for providing a buffered signal;
    a tunable buffer receiving the clock signal and to provide a duty cycle tuned signal responsive to the complementary duty cycle correction signals; and
    an interpolator coupled to the buffer and the tunable buffer for interpolating the buffered signal and the duty cycle tuned signal to provide the duty cycle corrected clock signal.

12. The processor of claim 10, wherein the clock circuit further comprises a calibrated reference source coupled to the comparator for providing the reference signal.

13. The processor of claim 10, wherein the shift register comprises a plurality of cascaded flip-flops providing N-bit complementary duty cycle correction signals to the duty cycle interpolator.

14. The processor of claim 10, wherein the clock circuit further comprises a divider coupled to the shift register for receiving the clock signal and providing a divided clock signal to the shift register.

15. The processor of claim 10, wherein the duty cycle corrected clock signal has a duty cycle in the range of approximately +/−0.5% of 50%.

16. A device comprising the processor of claim 10, the device comprising at least one of a group consisting of: a computer; a digital book; a printer; a scanner; a television; a computer-enabled cellular phone; and a set-top box.

17. A software program embodied on computer-readable media containing instructions that when executed enable the manufacture of a clock circuit, comprising:
  a first plurality of instructions configured to create a duty cycle interpolator having a clock signal input and providing a duty cycle corrected clock signal;
  a second plurality of instructions configured to create a low pass filter coupled to the duty cycle interpolator to filter the duty cycle corrected clock signal and provide a filtered signal;
  a third plurality of instructions configured to create a comparator coupled to the low pass filter to compare the filtered signal to a reference signal and provide complementary digital output signals; and
  a fourth plurality of instructions configured to create a shift register coupled to the comparator and the duty cycle interpolator to process the complementary digital output signals and to provide complementary duty cycle correction signals to the duty cycle interpolator for adjusting the duty cycle of the clock signal to provide the duty cycle corrected clock signal.

18. The software program of claim 17, further comprising a fifth plurality of instructions configured to create a calibrated reference source coupled to the comparator for providing the reference signal.

19. The software program of claim 18, further comprising a sixth plurality of instructions configured to create a divider coupled to the shift register for receiving the clock signal and providing a divided clock signal to the shift register.

* * * * *